United States Patent
Park et al.

(10) Patent No.: US 10,923,341 B2
(45) Date of Patent: Feb. 16, 2021

(54) METHOD OF FORMING OXIDE LAYER AND METHOD OF FABRICATING SEMICONDUCTOR DEVICE

(71) Applicant: SAMSUNG ELECTRONICS CO., LTD., Suwon-si (KR)

(72) Inventors: Jin-wook Park, Seoul (KR); Tae-jin Yim, Seoul (KR); Youn-joung Cho, Hwaseong-si (KR); Hiroshi Morita, Tokyo (JP); Yasuhisa Furihata, Tokyo (JP)

(73) Assignees: Samsung Electronics Co., Ltd., Suwon-Si (KR); Adeka Corporation, Tokyo (JP)

( * ) Notice: Subject to any disclaimer, the term of this patent is extended or adjusted under 35 U.S.C. 154(b) by 155 days.

(21) Appl. No.: 16/292,939

(22) Filed: Mar. 5, 2019

(65) Prior Publication Data

US 2019/0279862 A1 Sep. 12, 2019

(30) Foreign Application Priority Data

Mar. 9, 2018 (KR) .................... 10-2018-0028305

(51) Int. Cl.
*H01L 21/02* (2006.01)
*H01L 21/762* (2006.01)
*H01L 27/108* (2006.01)
*C09D 183/00* (2006.01)

(52) U.S. Cl.
CPC ........ *H01L 21/0223* (2013.01); *C09D 183/00* (2013.01); *H01L 21/02164* (2013.01); *H01L 21/02216* (2013.01); *H01L 21/02282* (2013.01); *H01L 21/02323* (2013.01); *H01L 21/02337* (2013.01); *H01L 21/76224* (2013.01); *H01L 27/10855* (2013.01)

(58) Field of Classification Search
None
See application file for complete search history.

(56) References Cited

U.S. PATENT DOCUMENTS

| | | | |
|---|---|---|---|
| 5,416,230 A * | 5/1995 | Jung | C08G 77/12 556/451 |
| 5,786,278 A | 7/1998 | Fry | |
| 6,448,331 B1 | 9/2002 | Ioka et al. | |
| 6,599,846 B2 | 7/2003 | Komatsu et al. | |
| 6,620,704 B2 | 9/2003 | Miura et al. | |
| 6,780,499 B2 | 8/2004 | Gates et al. | |

(Continued)

FOREIGN PATENT DOCUMENTS

| | | |
|---|---|---|
| JP | 05-283377 A | 10/1993 |
| JP | 09-211870 A | 8/1997 |
| JP | 2001-206710 A | 7/2001 |

*Primary Examiner* — Angel Roman
(74) *Attorney, Agent, or Firm* — Lee IP Law, PC

(57) ABSTRACT

A method of forming an oxide layer, the method including forming a first material layer on a semiconductor substrate, the first material layer including a polysiloxane material, wherein, from among $Si-H_1$, $Si-H_2$, and $Si-H_3$ bonds included in the polysiloxane material, a percentage of $Si-H_2$ bonds ranges from about 40% to about 90%, performing a first annealing process on the first material layer in an inert atmosphere, and performing a second annealing process on the first material layer in an oxidative atmosphere.

20 Claims, 19 Drawing Sheets

(56) References Cited

U.S. PATENT DOCUMENTS

| | | |
|---|---|---|
| 7,205,030 B2 | 4/2007 | Misawa et al. |
| 7,229,910 B2 | 6/2007 | Usami |
| 7,244,658 B2 | 7/2007 | Yieh et al. |
| 7,517,815 B2 | 4/2009 | Cho et al. |
| 8,211,993 B2 | 7/2012 | Harimoto et al. |
| 2004/0213911 A1* | 10/2004 | Misawa ............ H01L 21/31695 427/387 |

* cited by examiner

METHOD OF FORMING OXIDE LAYER AND METHOD OF FABRICATING SEMICONDUCTOR DEVICE

CROSS-REFERENCE TO RELATED APPLICATION

Korean Patent Application No. 10-2018-0028305, filed on Mar. 9, 2018, in the Korean Intellectual Property Office, and entitled: "Method of Forming Oxide Layer and Method of Fabricating Semiconductor Device," is incorporated by reference herein in its entirety.

BACKGROUND

1. Field

Embodiments relate to a method of forming an oxide layer and a method of manufacturing a semiconductor device.

2. Description of the Related Art

Efforts are continually underway to increase the degree of integration of semiconductor devices. Such efforts include efforts to advance processing operations used in the manufacture of such highly integrated semiconductor devices.

SUMMARY

Embodiments are directed to a method of forming an oxide layer, the method including forming a first material layer on a semiconductor substrate, the first material layer including a polysiloxane material, wherein, from among Si—$H_1$, Si—$H_2$, and Si—$H_3$ bonds included in the polysiloxane material, a percentage of Si—$H_2$ bonds ranges from about 40% to about 90%, performing a first annealing process on the first material layer in an inert atmosphere, and performing a second annealing process on the first material layer in an oxidative atmosphere.

Embodiments are also directed to a method of manufacturing a semiconductor device, the method including forming a trench in a semiconductor substrate, the trench defining an active region, forming a first material layer in the trench, the first material layer including a polysiloxane material, a weight-average molecular weight of the polysiloxane material ranging from about 5,000 to about 25,000, performing a first annealing process on the first material layer in an inert atmosphere, performing a second annealing process on the first material layer on which the first annealing process has been performed, in an oxidative atmosphere; and forming a memory device in the active region.

Embodiments are also directed to a method of forming an oxide layer, the method including forming a first material layer on a semiconductor substrate, the first material layer including a polysiloxane material, the polysiloxane material being prepared by Equation 1:

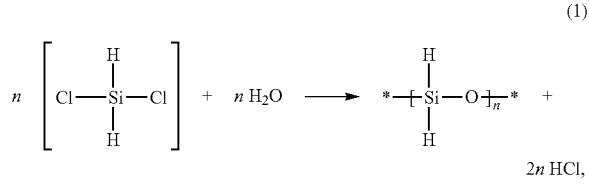

(1)

performing a first annealing process on the first material layer in an inert atmosphere, and performing a second annealing process on the first material layer in an oxidative atmosphere.

BRIEF DESCRIPTION OF THE DRAWINGS

Features will become apparent to those of skill in the art by describing in detail example embodiments with reference to the attached drawings in which.

DETAILED DESCRIPTION

An example embodiment provides a method of forming an oxide layer on a substrate.

Figure 1:
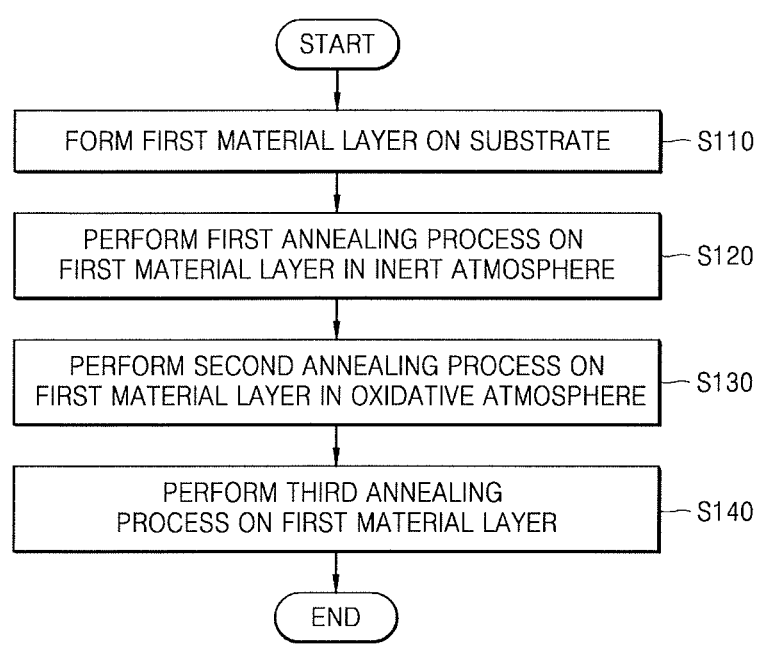
FIG. 1 illustrates a flowchart of a method of forming an oxide layer, according to an example embodiment.
Figure 2A:
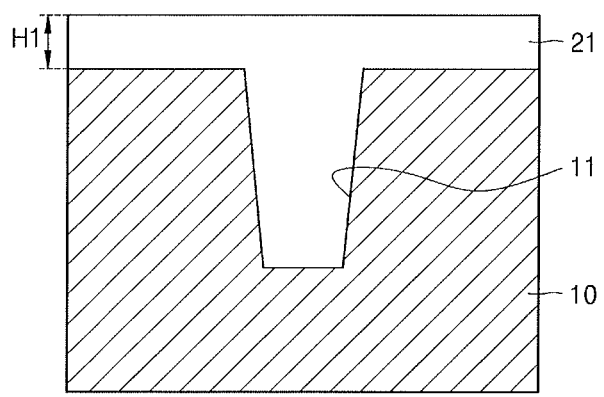
FIGS. 2A to 2C illustrate side cross-sectional views of a method of forming an oxide layer, according to an example embodiment.
Figure 2B:
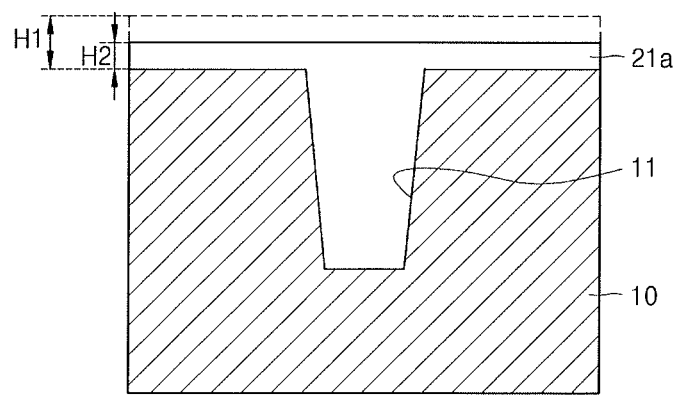
Figure 2C:
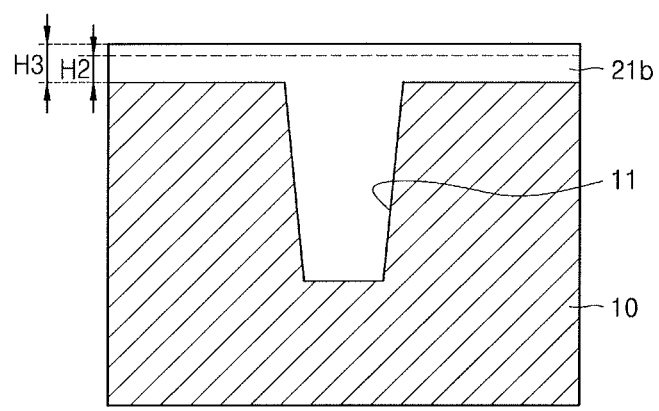

FIG. 1 illustrates a flowchart of a method of forming an oxide layer, according to an example embodiment. FIGS. 2A to 2C illustrate side cross-sectional views of a method of forming an oxide layer, according to an example embodiment.

Referring to FIGS. 1 and 2A, a first material layer 21 including a polysiloxane material may be formed on a substrate 10 (S110).

The substrate 10 may be a semiconductor substrate. In an example embodiment, the semiconductor substrate may include silicon (Si), for example, crystalline silicon, polycrystalline silicon, or amorphous silicon. In another example embodiment, the semiconductor substrate may include a semiconductor such as germanium (Ge), or a compound semiconductor such as silicon germanium (SiGe), silicon carbide (SiC), gallium arsenide (GaAs), indium arsenide (InAs), or indium phosphide (InP).

In an example embodiment, a structure (e.g., a trench 11) may be formed in the substrate 10. The trench 11 may have both sidewalls and a bottom surface formed therebetween. The both sidewalls may have tapered sections. In an example embodiment, the trench 11 may have a decreasing width toward the bottom surface thereof.

A first material layer 21 may be formed on the substrate 10. The first material layer 21 may include a polysiloxane material. The first material layer 21 may be formed using a spin coating process.

In an example embodiment, the polysiloxane material may not substantially include atomic species other than silicon (Si), oxygen (O), and hydrogen (H). Here, when the polysiloxane material does not substantially include other atomic species, it may indicate that the content of other atomic species is extremely low, for example, less than 1 atomic percent (at %), less than 0.5 at %, less than 0.1 at %, or less than 0.05 at %, as compared to the contents of silicon (Si), oxygen (O), and hydrogen (H), but not indicate that other atomic species are absolutely absent.

The polysiloxane material may have a structure shown in Formula 1, which is merely an example schematic diagram of the polysiloxane material.

[Formula 1]

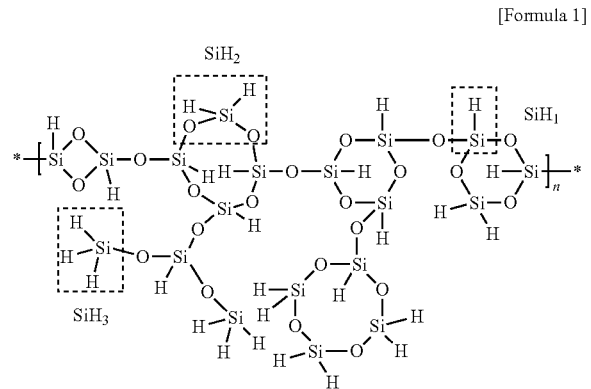

In Formula 1, Si atoms may be bonded to each other via an oxygen atom or bonded to a hydrogen atom and terminated, and direct bond between the Si atoms may be substantially absent. Here, when the direct bond between the Si atoms is substantially absent, it may be understood that the number of Si—Si bonds is extremely low (e.g., less than 1%, less than 0.5%, less than 0.1%, or less than 0.05%) as compared with the number of other bonds (e.g., the number of Si—H bonds or Si—O bonds), but the Si—Si bond may not be totally absent.

As may be seen from Formula 1, about 1 to 3 hydrogen atoms may be bonded to the Si atoms. Although it is not impossible to bond one Si atom to four oxygen atoms at the same time, the bonding of one Si atom to four atoms of oxygen, which is bulkier than hydrogen, at the same time may be markedly rare as compared with other cases and unstable in terms of energy so that a bond between one Si atom and four oxygen atoms may be converted into another bond.

Hereinafter, a bond between one Si atom and one hydrogen atom will be referred to as a Si—$H_1$ bond, a bond between one Si atom and two hydrogen atoms will be referred to as a Si—$H_2$ bond, and a bond between one Si atom and three hydrogen atoms will be referred to as a Si—$H_3$ bond. Also, the Si—$H_1$ bond, the Si—$H_2$ bond, and the Si—$H_3$ bond will be collectively referred to as Si—$H_n$ bonds.

From among the Si—$H_n$ bonds included in the polysiloxane material of Formula 1, a percentage of the Si—$H_2$ bonds may be much higher than a percentage of the Si—$H_1$ or Si—$H_3$ bonds. For example, from among the Si—$H_n$ bonds included in the polysiloxane material of Formula 1, the percentage of the Si—$H_2$ bonds may be high, for example, about 40% to about 99%, about 45% to about 95%, about 50% to about 90%, or about 60% to about 90%.

In an example embodiment, from among the Si—$H_n$ bonds, a percentage of the Si—$H_3$ bonds may be lower than the percentage of the Si—$H_2$ bonds. For example, from among the Si—$H_n$ bonds, the percentage of the Si—$H_3$ bonds may be about 0.01% to about 15%, about 0.01% to about 10%, about 0.05% to about 8%, or about 0.1% to about 5%.

As shown in Formula 2, Si—O bonds may make up a large portion of a general hydrogen silsesquioxane (HSQ), which is a siloxane compound, while a percentage of Si—H bonds may be low, and the HSQ may substantially include only Si—$H_1$ bonds from among the Si—$H_n$ bonds.

[Formula 2]

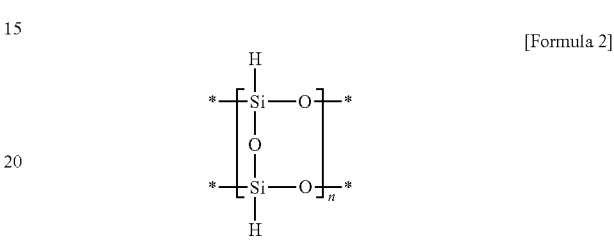

In contrast, in the polysiloxane material of Formula 1, the Si—O bonds and the Si—H bonds may be included at the same level to form a plurality of bonds. In some cases, the Si—H bonds may be included at a higher percentage than the Si—O bonds.

Figure 3:
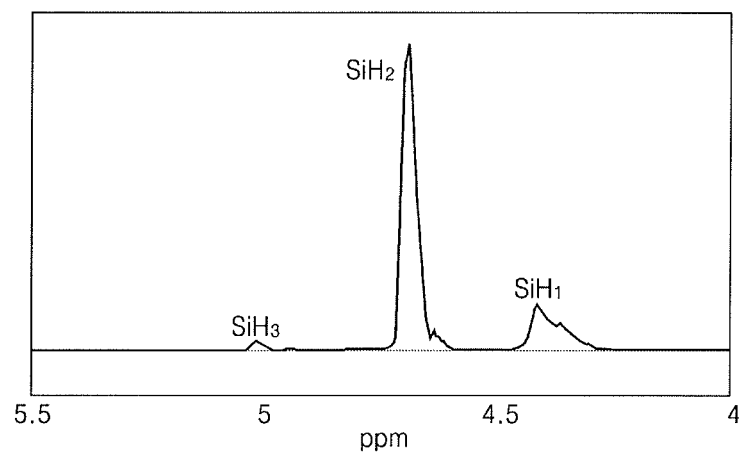
FIG. 3 illustrates a portion of a nuclear magnetic resonance (NMR) spectrum, which shows $^1$H NMR analysis results of a polysiloxane material according to an example embodiment.

Relative percentages of the Si—$H_1$, Si—$H_2$, and Si—$H_3$ bonds in the polysiloxane material may be measured via nuclear magnetic resonance (NMR) analysis. FIG. 3 shows a portion of an NMR spectrum, which shows $^1$H NMR analysis results of a polysiloxane material according to an example embodiment.

Referring to FIG. 3, it can be seen that peaks representing the Si—$H_1$, Si—$H_2$, and Si—$H_3$ bonds have values of 4.4 ppm, 4.7 ppm, and 5.0 ppm, respectively. It will be understood that relative percentages of the Si—$H_1$, Si—$H_2$, and Si—$H_3$ bonds are equal to relative percentages of areas below the peaks corresponding thereto. In an example embodiment, when tangent lines are constructed at inflection points on both inclined surfaces of the corresponding peak, the percentage of each of the Si—$H_1$, Si—$H_2$, and Si—$H_3$ bonds may be represented by an area of a triangle formed by the two tangent lines and a base line of the spectrum.

The polysiloxane material may be synthesized according to Equation 1:

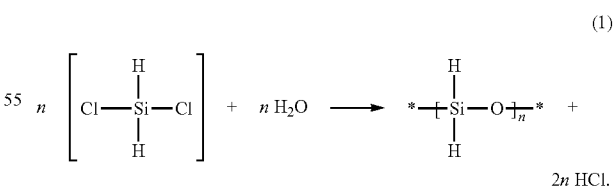

The synthesis of the polysiloxane material may be performed at room temperature or lower, for example, a temperature of about −40° C. to about 25° C. Also, in the synthesis process, a monomer may be dissolved in a solvent, for example, an organic solvent such as iso-nonane, and polymerized. The solvent may be contained at a content of about 10% to about 50% by weight.

In the synthesis process, a weight-average molecular weight of the generated polysiloxane material and Si—$H_1$, Si—$H_2$, and Si—$H_3$ in the generated polysiloxane material may be controlled using, for example, a method that is described in detail in "Cyclic Polysiloxanes from the Hydrolysis of Dichlorosilane, Inorg. Chem., 1983, 22, p. 2163." Also, the polysiloxane material, which is a product of Equation 1, may be commercially available from ADEKA.

The polysiloxane material may have a weight-average molecular weight of about 4,000 to about 200,000. In an example embodiment, the polysiloxane material may have a weight-average molecular weight of about 5,000 to about 25,000. In an example embodiment, the polysiloxane material may have a weight-average molecular weight of about 10,000 to about 20,000. The weight-average molecular weight may be measured using, for example, a gel permeation chromatography (GPC) system.

If the polysiloxane material has a very low weight-average molecular weight, the polysiloxane material may have relatively poor coating characteristics so that a material layer may not be formed as desired. For example, after a polysiloxane material layer is formed, the polysiloxane material layer may be delaminated or lost. Conversely, if the polysiloxane material has a very large weight-average molecular weight, a trench having a narrow width may not be suitably filled with the polysiloxane material. With the continuous shrinkage of critical dimensions (CDs) of semiconductor devices, widths of trenches configured to isolate the semiconductor devices may be reduced to several nm to several tens of nm. A polysiloxane material having a very high weight-average molecular weight may not fill such trenches well.

A first material layer 21 formed on a substrate 10 may have a height H1 on a flat top surface of the substrate 10. As described above, the first material layer 21 may be formed using a spin coating process. The height H1 of the first material layer 21 may be controlled by adjusting a rotation rate of the substrate 10 for the spin coating process, a temperature and viscosity of the polysiloxane material, and a time for which the substrate 10 rotates.

Rearrangement of Atoms

Referring to FIGS. 1 and 2B, a first annealing process may be performed on a first material layer 21a (S120). The first annealing process may be performed in an inert atmosphere. In an example embodiment, the first annealing process may be performed in an atmosphere of an inert gas or a gas having a relatively low chemical reactivity, such as nitrogen ($N_2$), helium (He), neon (Ne), argon (Ar), carbon dioxide ($CO_2$), or a mixture thereof.

In an example embodiment, the first annealing process may be performed at a temperature of about 500° C. to about 700° C. In an example embodiment, the first annealing process may be performed at a temperature of about 550° C. to about 700° C. In an example embodiment, the first annealing process may be performed at a temperature of about 600° C. to about 700° C.

If the first annealing process is performed at a very high temperature, the uniformity of a silicon oxide layer may be degraded. If the first annealing process is performed at a very low temperature, the film quality of the generated silicon oxide layer may be non-uniform and delicate.

In an example embodiment, the first annealing process may be performed for about 20 minutes to about 90 minutes. In an example embodiment, the first annealing process may be performed for about 30 minutes to about 80 minutes. In an example embodiment, the first annealing process may be performed for about 30 minutes to about 60 minutes.

If the first annealing process is performed for a very small amount of time, the uniformity of the silicon oxide layer may be degraded. If the first annealing process is performed for a very large amount of time, economical disadvantages may occur.

After the first annealing process is performed, a thickness of the first material layer 21a may be reduced. Thus, as shown in FIG. 2A, directly after the first material layer 21 is formed, the first material layer 21 may have a height H1 on the flat top surface of the substrate 10, whereas, as shown in FIG. 2B, after the first annealing process, the first material layer 21a may have a height H2 that is less than the height H1 on the flat top surface of the substrate 10.

The first material layer 21a may be cured while decreasing a volume thereof. For example, the first material layer 21a may shrink in a vertical direction. In an example embodiment, compressive stress or tensile stress may not be applied or not significantly applied to the substrate 10 in a lateral direction despite the first annealing process, although some lateral stress may be generated as a result of the first annealing process. Excessive lateral stress may cause damage to structures already formed or to be subsequently formed on the substrate 10.

Without being bound to a particular theory, it is believed that the above-described first annealing process may rearrange atoms in the first material layer 21a. For example, the rearrangement of the atoms may include breaking a —Si—Si— bond in a polysiloxane material, which is a raw material for preparing silicon oxide, and converting the —Si—Si— bond to a —Si—O—Si— bond or two —Si—H bonds.

Oxidation

Referring to FIGS. 1 and 2C, a second annealing process may be performed on the first material layer 21a (S130). The second annealing process may be performed in an oxidative atmosphere. In an example embodiment, the second annealing process may be performed in an atmosphere including a gas such as $O_2$, $H_2O(g)$, $H_2O_2(g)$, $O_3$, a combination thereof, etc. In an example embodiment, the second annealing process may be continuously performed directly after the first annealing process described with reference to FIG. 2B is ended.

In an example embodiment, the second annealing process may be performed at a temperature of about 500° C. to about 700° C. In an example embodiment, the second annealing process may be performed at a temperature of about 550° C. to about 700° C. In an example embodiment, the second annealing process may be performed at a temperature of about 600° C. to about 700° C.

If the second annealing process is performed at a very high temperature, the uniformity of a silicon oxide layer may be degraded. If the second annealing process is performed at a very low temperature, the film quality of the generated silicon oxide layer may be non-uniform and delicate.

In an example embodiment, the second annealing process may be performed for about 20 minutes to about 90 minutes. In an example embodiment, the second annealing process may be performed for about 30 minutes to about 80 minutes. In an example embodiment, the second annealing process may be performed for about 30 minutes to about 60 minutes.

If the second annealing process is performed for a very small amount of time, the uniformity of the silicon oxide layer may be degraded. If the second annealing process is performed for a very large amount of time, economical disadvantages may occur.

After the second annealing process is performed, a thickness of a first material layer 21b may be slightly increased.

Thus, as shown in FIG. 2B, directly after the first annealing process, the first material layer 21a may have a height H2 on the flat top surface of the substrate 10, whereas, as shown in FIG. 2C, after the second annealing process, the first material layer 21b may have a height $H_3$ that is slightly greater than the height H2 on the flat top surface of the substrate 10.

A volume of the first material layer 21b may be slightly increased after the second annealing process is performed on the first material layer 21a in an oxidative atmosphere. As a result, a thickness of the first material layer 21b of FIG. 2C may be slightly greater than a thickness of the first material layer 21a of FIG. 2B. Lateral stress of the first material layer 21b obtained after the second annealing process may be increased more than lateral stress of the first material layer 21a obtained directly after the first annealing process. In an example embodiment, the lateral stress may be compressive stress. The compressive stress may be much lower than stress of a general oxide, for example, silicon oxide obtained using a material, such as perhydro polysilazane (PHPS). In an example embodiment, stress of silicon oxide formed using a method according to the present example embodiment may be about ⅓ or less of stress of silicon oxide formed using PHPS.

If silicon oxide formed to provide a device isolation film has a very high stress, there may be a high possibility that a structure already formed or to be formed will be damaged. Accordingly, as stress of silicon oxide decreases, semiconductor devices having higher reliability may be obtained.

Without being bound to a particular theory, it is believed that the above-described second annealing process may receive oxygen atoms from an oxidizer in an oxidative atmosphere and generate additional —Si—O—Si— bonds in the first material layer 21b.

Densification

In an example embodiment, a third annealing process may be further performed on the first material layer 21b (S140). In an example embodiment, the third annealing process may be performed in an inert atmosphere. The third annealing process may further densify the film quality of a formed silicon oxide layer.

The third annealing process may be performed in a temperature range of about 700° C. to about 1250° C. In an example embodiment, the third annealing process may be performed in a temperature range of about 800° C. to about 1050° C. In an example embodiment, the third annealing process may be performed in a temperature range of about 850° C. to about 950° C.

In an example embodiment, the third annealing process may be performed for about 20 minutes to about 90 minutes. In an example embodiment, the third annealing process may be performed for about 30 minutes to about 80 minutes. In an example embodiment, the third annealing process may be performed for about 30 minutes to about 60 minutes.

Without being bound to a particular theory, it is believed that the above-described third annealing process may anneal the first material layer 21b and rearrange atoms in a denser structure.

When the above-described first and second annealing processes are completed, —Si—$H_n$ bonds in the first material layer may largely or completely disappear, i.e., may be substantially absent. Here, the absence of the —Si—$H_n$ bonds may indicate that —Si—O—Si— bonds make up a large portion of bonds present in the first material layer 21b, and the number of —Si—$H_n$ bonds may be substantially immaterial compared to the number of —Si—O—Si— bonds. The absence of the —Si—$H_n$ bonds may not indicate absolute absence of the —Si—$H_n$ bonds.

The above-described absence of the —Si—$H_n$ bond may be confirmed via Fourier transform infrared (FT-IR) spectroscopic analysis. In an example embodiment, in the FT-IR spectroscopic analysis, the —Si—H bond may have a peak in a wavenumber range of about 2000 $cm^{-1}$ to about 2400 $cm^{-1}$. The absence of the —Si—$H_n$ bond may be confirmed based on the fact that the —Si—H bond does not have a peak in the wavenumber range.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Figure 4:
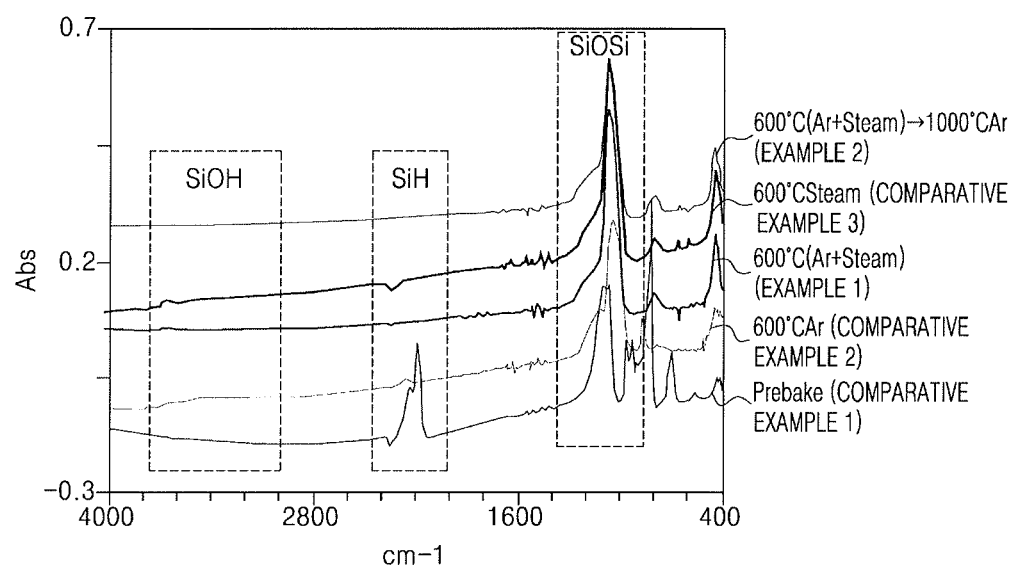
FIG. 4 illustrates Fourier transform infrared (FT-IR) analysis results of material layers of Examples 1 and 2 and Comparative Examples 1 to 3.

As shown in Table 1 below, Examples 1 and 2 and Comparative Examples 1 and 2 may correspond to the material layers formed in the above-described operations, respectively, and Comparative Example 3 may correspond to a material layer on which only the second annealing process has been performed without the first annealing process. FIG. 4 shows FT-IR analysis results of material layers of Examples 1 and 2 and Comparative Examples 1 to 3.

TABLE 1

|  | First annealing (Ar, 30 min, 600° C.) | Second annealing ($H_2O$, 60 min, 600° C.) | Third annealing (Ar, 30 min, 1000° C.) |
| --- | --- | --- | --- |
| Comparative Example 1 | — | — | — |
| Comparative Example 2 | ◯ | — | — |
| Example 1 | ◯ | ◯ | — |
| Comparative Example 3 | — | ◯ | — |
| Example 2 | ◯ | ◯ | ◯ |

Referring to Table 1 and FIG. 4, Comparative Example 1 had a material layer on which no annealing process was performed. In Comparative Example 1, a peak was confirmed in a wavenumber range of about 2000 $cm^{-1}$ to about 2400 $cm^{-1}$, which indicated a —Si—$H_n$ bond. In contrast, Comparative Example 3 and Examples 1 and 2 had material layers on which at least one annealing process was performed. In Comparative Example 3 and Examples 1 and 2, it was confirmed that the peak disappeared in the wavenumber range of about 2000 $cm^{-1}$ to about 2400 $cm^{-1}$.

Comparative Example 2 had a material layer obtained directly after the first annealing process was performed. In Comparative Example 2, a weak peak was confirmed in the wavenumber range of about 2000 $cm^{-1}$ to about 2400 $cm^{-1}$. However, Examples 1 and 2 and Comparative Example 3 had material layers on which the second annealing was performed. In Examples 1 and 2 and Comparative Example 3, it was confirmed that the peak completely disappeared in the wavenumber range of about 2000 $cm^{-1}$ to about 2400 $cm^{-1}$, which indicated the bond.

Therefore, it is believed that the —Si—$H_n$ bond disappears due to the second annealing process performed in a water vapor atmosphere.

Figure 5:
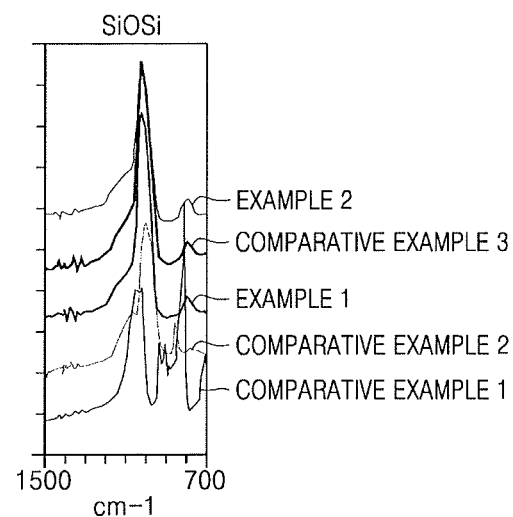
FIG. 5 illustrates detailed spectra in a wavenumber range of about 700 $cm^{-1}$ to about 1500 $cm^{-1}$ from among spectra shown in FIG. 4.

FIG. 5 shows detailed spectra in a wavenumber range of about 700 $cm^{-1}$ to about 1500 $cm^{-1}$ from among spectra shown in FIG. 4.

Referring to FIG. 5, peaks of Comparative Example 3 and Examples 1 and 2 were increased more than peaks of Comparative Examples 1 and 2, and it was observed that degrees to which the peaks were increased were similar to each other.

Therefore, it is believed that the —Si—O—Si— bond was significantly generated after the second annealing process was performed in an oxidizing atmosphere.

Figure 6:
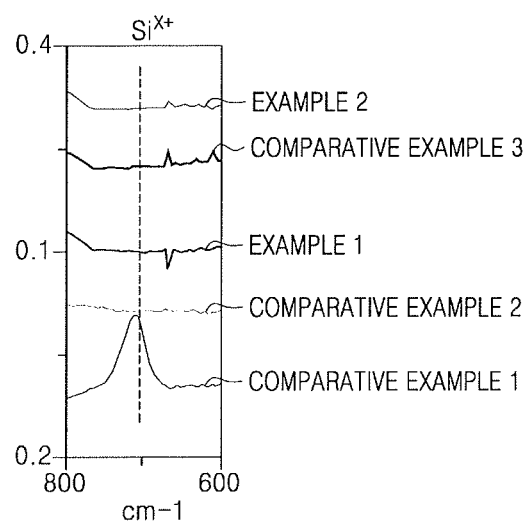
FIG. 6 illustrates detailed spectra in a wavenumber range of about 600 $cm^{-1}$ to about 800 $cm^{-1}$, which corresponds to a —Si—Si— bond, from among the spectra shown in FIG. 4.

FIG. 6 shows detailed spectra in a wavenumber range of about 600 cm$^{-1}$ to about 800 cm$^{-1}$, which corresponds to a —Si—Si— bond, from among the spectra shown in FIG. 4.

Referring to FIGS. 4 and 6, it can be seen that a peak of Comparative Example 1 is shown in a wavenumber range of about 600 cm$^{-1}$ to about 800 cm$^{-1}$, while peaks disappear in Comparative Examples 2 and 3 and Examples 1 and 2.

Therefore, it is believed that atoms were rearranged due to the first annealing process and, particularly, the —Si—Si— bonds were replaced by —Si—O—Si— bonds.

Referring back to FIG. 4, in Comparative Examples 2 and 3 on which one of the first and second annealing processes was performed, a weak peak, which represents a hydroxyl group (—OH), was observed in a wavenumber range of about 3000 cm$^{-1}$ to about 3700 cm$^{-1}$.

In Comparative Example 2, it is believed that the hydroxyl group was partially generated during a process of rearranging atoms due to the first annealing process. In Comparative Example 3, it is believed that the hydroxyl group was partially generated during a process of introducing oxygen atoms due to the second annealing process performed in the oxidative atmosphere.

In contrast, in Examples 1 and 2 on which the first and second annealing processes were performed, a peak that represents a hydroxyl group (—OH) was not observed. Accordingly, both the first and second annealing processes may be used to obtain dense —Si—O—Si— bonds.

In the following, a silicon oxide layer was manufactured while varying a molecular weight of a polysiloxane material in a range of about 5,000 to about 25,000. Specific manufacturing conditions are as shown in Table 2 below (Examples 1 and 3 to 7). A silicon oxide layer was manufactured using torene silazene (TOSZ) having a molecular weight of about 6,000 to about 15,000 instead of a polysiloxane material. Specific manufacturing conditions are as shown in Table 2 below (Comparative Examples 4 and 5). A silicon oxide layer was manufactured using HSQ as a general polysiloxane material. Specific manufacturing conditions are as shown in Table 2 (Comparative Example 6). The TOSZ may refer to PHPS.

In Table 2, a shrinkage rate ("SHK") (%) was calculated by measuring a variation in thickness before and after an annealing process using an ellipsometer, and stress was calculated through a correlation with warpage of a substrate. A chemical mechanical polishing (CMP) removal rate was obtained by measuring a film-quality removal rate under the same CMP conditions. A wet etch resistance (WER) was obtained by measuring a wet etch rate after each material layer was formed on a flat substrate.

TABLE 2

| | | First annealing | | | Second annealing | | | | | | |
|---|---|---|---|---|---|---|---|---|---|---|---|
| | MW | Temp (° C.) | Time (min) | Atmos | Temp. (° C.) | Time (min) | Atmos | SHK (%) | Stress (MPa) | CMP (Å/sec) | WER (Å/min) |
| Ex. 1 | 20000 | 600 | 30 | $N_2$ | 600 | 60 | $H_2O$ | 13 | −31 | 70 | 78 |
| Ex. 3 | 25000 | 600 | 30 | $N_2$ | 600 | 60 | $H_2O$ | 13 | −31 | 77 | 84 |
| Ex. 4 | 15000 | 600 | 30 | $N_2$ | 600 | 60 | $H_2O$ | 13 | −33 | 70 | 77 |
| Ex. 5 | 10000 | 600 | 30 | $N_2$ | 600 | 60 | $H_2O$ | 13 | −31 | 70 | 78 |
| Ex. 6 | 5000 | 600 | 30 | $N_2$ | 600 | 60 | $H_2O$ | 15 | −28 | 71 | 76 |
| Ex. 7 | 6000 | 600 | 30 | $N_2$ | 600 | 60 | $H_2O$ | 13 | −35 | 70 | 76 |
| Comp. Ex. 4 | 6000 | 400 | 30 | $O_2$ | 600 | 30 | $H_2O$ | 17 | 91 | 70 | 75 |
| Comp. Ex. 5 | 13000 | 600 | 30 | $O_2$ | 600 | 60 | $H_2O$ | 13 | 88 | 70 | 77 |
| Comp. Ex. 6 | 20000 | 600 | 30 | $N_2$ | 600 | 60 | $H_2O$ | 16 | 74 | 73 | 76 |

As shown in Table 2, in Examples 1, 3, and 7 using polysiloxane materials according to embodiments, shrinkage rates were generally stable (about 13%), and stress was relatively low (about 28 MPa to about 33 MPa). In contrast, Comparative Examples 4 and 5 using TOSZ (i.e., PHPS) showed that stress was much higher than in Examples 1, 3, and 7. In Comparative Example 6 using HSQ, although stress was lower than in Comparative Examples 4 and 5, a shrinkage rate was somewhat high, and stress was much higher than in Examples 1, 3, and 7.

Therefore, it can be seen that according to a method of embodiments, a silicon oxide layer having remarkably low stress may be formed while stabilizing a shrinkage rate.

Influences of percentages of —Si—H$_n$ bonds in polysiloxane, polysiloxane materials having various percentages were determined using $SiH_2Cl_2$ as a starting material, and silicon oxide layers were manufactured using the polysiloxane materials. SiH$_n$ percentages of respective Examples are shown in Table 3 below.

TABLE 3

| | | SiH$_n$ | | | First annealing | | | Second annealing | | | | |
|---|---|---|---|---|---|---|---|---|---|---|---|---|
| | MW | SiH$_1$ (%) | SiH$_2$ (%) | SiH$_3$ (%) | Temp. (° C.) | Time (min) | Atmos. | Temp. (° C.) | Time (min) | Atmos. | SHK (%) | Stress (MPa) |
| Ex. 1 | 20000 | 32 | 60 | 8 | 600 | 30 | $N_2$ | 600 | 60 | $H_2O$ | 13 | −31 |
| Ex. 3 | 25000 | 30 | 63 | 7 | 600 | 30 | $N_2$ | 600 | 60 | $H_2O$ | 13 | −31 |

TABLE 3-continued

| | | SiH$_n$ | | | First annealing | | | Second annealing | | | | |
|---|---|---|---|---|---|---|---|---|---|---|---|---|
| | MW | SiH$_1$ (%) | SiH$_2$ (%) | SiH$_3$ (%) | Temp. (° C.) | Time (min) | Atmos. | Temp. (° C.) | Time (min) | Atmos. | SHK (%) | Stress (MPa) |
| Ex. 4 | 15000 | 3 | 96 | 1 | 600 | 30 | N$_2$ | 600 | 60 | H$_2$O | 13 | −33 |
| Ex. 5 | 10000 | 15 | 81 | 4 | 600 | 30 | N$_2$ | 600 | 60 | H$_2$O | 13 | −31 |
| Ex. 6 | 5000 | 41 | 50 | 9 | 600 | 30 | N$_2$ | 600 | 60 | H$_2$O | 15 | −28 |
| Ex. 7 | 6000 | 43 | 45 | 12 | 600 | 30 | N$_2$ | 600 | 60 | H$_2$O | 13 | −35 |
| Ex. 8 | 23000 | 35 | 43 | 22 | 600 | 30 | N$_2$ | 600 | 60 | H$_2$O | 17 | −37 |
| Comp. Ex. 6 | 20000 | 98 | 2 | 0 | 600 | 30 | N$_2$ | 600 | 60 | H$_2$O | 16 | 74 |
| Comp. Ex. 7 | 26000 | 50 | 36 | 14 | 600 | 30 | N$_2$ | 600 | 60 | H$_2$O | 17 | 59 |
| Comp. Ex. 8 | 33000 | 63 | 29 | 8 | 600 | 30 | N$_2$ | 600 | 60 | H$_2$O | 16 | 52 |

As shown in Table 3, when a SiH$_2$ percentage ranges from about 43% to about 96%, the silicon oxide layer exhibited a relatively stable shrinkage rate and relatively low stress (less than 40 MPa). In contrast, when the SiH$_2$ percentage was less than 40%, a shrinkage rate of the silicon oxide layer was slightly increased, and stress of the silicon oxide layer was markedly increased (more than 50 MPa).

Figure 7A:
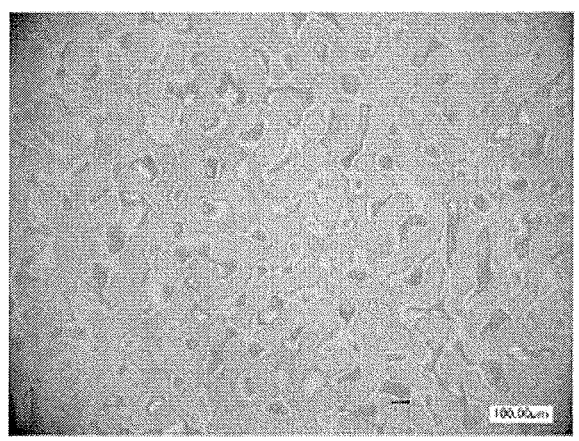
FIGS. 7A to 7C illustrate images obtained directly before a first annealing process is performed on siloxane material layers of Examples 6, 5, and 1, respectively.
Figure 7B:
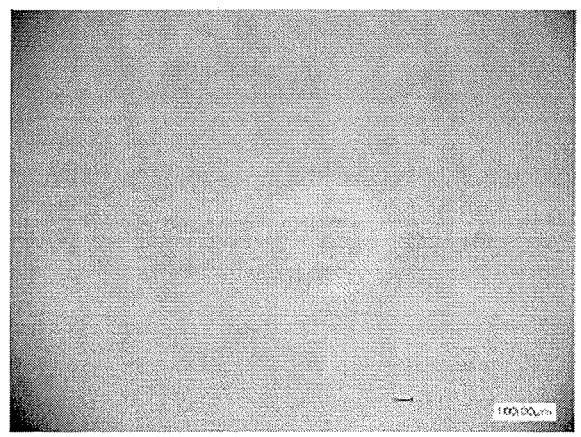
Figure 7C:
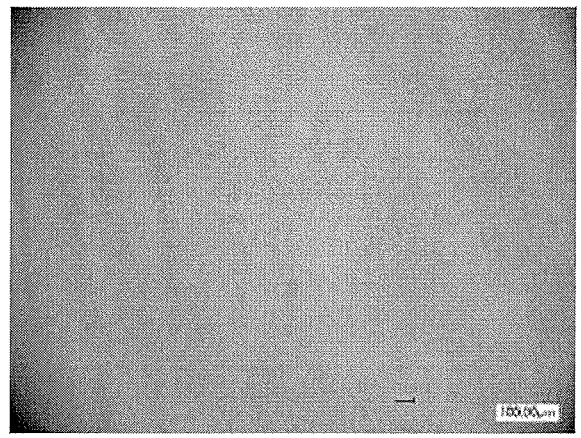

FIGS. 7A to 7C are images obtained directly before a first annealing process is performed on siloxane material layers of Examples 6, 5, and 1, respectively.

Referring to FIG. 7A, in Example 6, it was observed that the silicon oxide layer had partially unstable morphology and some particles were generated. Referring to FIG. 7B, in Example 5, although the silicon oxide layer initially had good morphology, some particles were generated on the surface of the silicon oxide layer over time. Referring to FIG. 7C, Example 1 had good morphology without generating particles.

Examples 9 to 11

A first annealing process and a second annealing process were performed under conditions shown in Table 4 below on a polysiloxane material (a weight-average molecular weight of 10,000; a SiH$_2$ percentage of 81%) used in Example 5, and a WER was measured.

TABLE 4

| | First annealing process | | | Second annealing process | | | |
|---|---|---|---|---|---|---|---|
| | Temp. (° C.) | Time (min) | Atmos. | Temp. (° C.) | Time (min) | Atmos. | WER (Å/min) |
| Example 9 | 500 | 30 | Ar | 500 | 60 | H$_2$O | 154 |
| Example 10 | 500 | 30 | Ar | 500 | 120 | H$_2$O | 162 |
| Example 11 | 600 | 30 | Ar | 600 | 60 | H$_2$O | 78 |

As shown in Table 4, when the first and second annealing processes were performed at a temperature of about 600° C. (refer to Example 11), the WER was increased much more than when the first and second annealing processes were performed at a temperature of about 500° C. (refer to Examples 9 and 10).

Example 12 and Comparative Examples 9 to 11

A first annealing process and/or a second annealing process were performed under conditions shown in Table 5 below on a polysiloxane material (weight-average molecular weight of 10,000; SiH$_2$ percentage of 81%) used in Example 5, and a WER and stress were measured.

TABLE 5

| | First annealing process | | | Second annealing process | | | XRR Density (g/cm$^3$) | Stress (MPa) | WER (Å/min) |
|---|---|---|---|---|---|---|---|---|---|
| | Temp. | Time | Atmos | Temp. | Time | Atmos | | | |
| Comparative Example 9 | 600 | 30 | Ar | — | — | — | 2.03 | 8 | — |
| Comparative Example 10 | — | — | — | 600 | 30 | O$_2$ | N/A | 55 | 177 |
| Comparative Example 11 | — | — | — | 600 | 30 | H$_2$O | 2.17 | 139 | 151 |
| Example 11 | 600 | 30 | Ar | 600 | 30 | H$_2$O | 2.26 | −31 | 78 |
| Example 12 | 600 | 30 | Ar | 600 | 30 | H$_2$O | N/A | −32 | 75 |

As shown in Table 5, when the second annealing process was not performed (refer to Comparative Example 9), although stress was low, the WER was extremely low. Also, when the first annealing process was not performed (refer to Comparative Examples 10 and 11), the WER was low, and high stress was measured.

In addition, an X-ray reflectivity (XRR) density was measured on Comparative Examples 9 and 11 and Example 11. As shown in Table 5, Example 11 on which both the first annealing process and the second annealing process were performed had the densest film quality.

Trenches were formed in two silicon substrates to form line-and-space structures, and silicon oxide layers were formed on the resultant structures using methods according to Example 1 and Comparative Example 4, respectively. Thereafter, the silicon oxide layers formed in the trenches were etched using a fluoric acid solution for the same amount of time, and a distribution of wet-etched depths of each of the silicon oxide layers was measured.

In the silicon oxide layer of Comparative Example 4, a difference between the greatest etched depth (136.3 nm) and the smallest etched depth (76.05 nm) was about 60 nm. In the silicon oxide layer of Example 1, a difference between the greatest etched depth (118.52 nm) and the smallest etched depth (89.38 nm) was about 29 nm. Accordingly, it can be seen that when the silicon oxide layer of Example 1 was used, a deviation of wet etched depths was reduced.

After the silicon oxide layer was wet etched, when a wet etched depth varied according to position and the silicon oxide layer had considerable stress, there may be a possibility of damaging a structure already formed or to be formed subsequently. The silicon oxide layer formed using a method according to embodiments may have as low stress as possible and exhibit improved wet-etching uniformity, thereby helping to manufacture a highly reliable semiconductor device.

By using a method of forming an oxide layer according to embodiments, a uniform oxide layer having remarkably low stress may be manufactured without voids. Also, a highly reliable semiconductor device may be manufactured by using the uniform oxide layer having low stress.

FIGS. 8A to 8M are side cross-sectional views of sequential operations of a method of manufacturing a semiconductor device 300, according to an example embodiment.

Figure 8A:
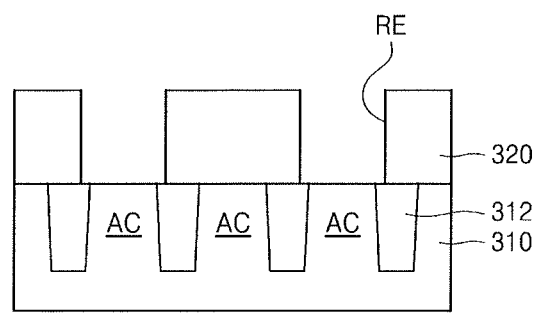
FIGS. 8A to 8M illustrate side cross-sectional views of sequential operations of a method of manufacturing a semiconductor device, according to an example embodiment.
Figure 8A:
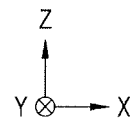

Referring to FIG. 8A, an interlayer insulating film 320 may be formed on a substrate 310 including a plurality of active regions AC and patterned to expose at least portions of the plurality of active regions AC. The interlayer insulating film 320 may include recesses RE exposing the active regions AC. The recesses RE may be contact holes or trenches. Although a case in which the recesses RE are contact holes has been described, it will be understood that trench-type recesses, etc., may be implemented.

The substrate 310 may include a semiconductor, such as silicon (Si) or germanium (Ge), or a compound semiconductor, such as silicon germanium (SiGe), silicon carbide (SiC), gallium arsenide (GaAs), indium arsenide (InAs), or indium phosphide (InP). In an example embodiment, the substrate 310 may include at least one of a Group III-V material and a Group IV material. The Group III-V material may be a binary, ternary, or quaternary compound including at least one Group-III atom and at least one Group-V atom. The Group III-V material may be a compound including atoms of at least one of In, Ga, and Al as Group-III atoms and atoms of at least one of As, P, and Sb as Group-V atoms. For example, the Group III-V material may be selected out of InP, $In_zGa_{1-z}As$ (0≤z≤1), and $Al_zGa_{1-z}As$ (0≤z≤1). The binary compound may be, for example, at least one of InP, GaAs, InAs, InSb, and GaSb. The ternary compound may be any one of InGaP, InGaAs, AlInAs, InGaSb, GaAsSb, and GaAsP. The Group-IV material may be silicon or germanium. In another example, the substrate 310 may have a silicon on insulator (SOI) structure. The substrate 310 may include a conductive region, for example, a doped well or a doped structure.

The plurality of active regions AC may be defined by a plurality of device isolation regions 312 formed in the substrate 310. The device isolation regions 312 may include a silicon oxide layer. The device isolation regions 312 may further include a silicon nitride film, a silicon oxynitride film, or a combination thereof.

The silicon oxide layer included in the device isolation region 312 may be formed using the method described with reference to FIGS. 1 to 2C.

The interlayer insulating film 320 may include a silicon oxide layer. The silicon oxide layer included in the interlayer insulating film 320 may be formed using the method described with reference to FIGS. 1 to 2C.

Figure 8B:
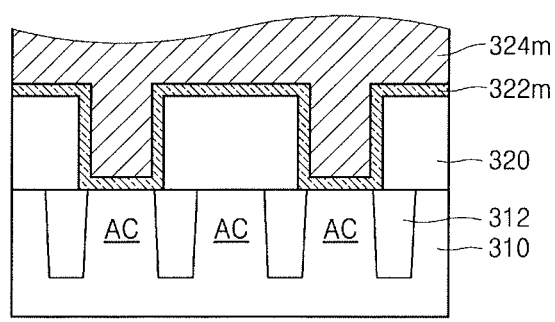
Figure 8B:
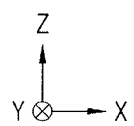

Referring to FIG. 8B, a barrier metal material layer 322m may be formed inside the recess unit RE and on the entire top surface of the interlayer insulating film 320. The barrier metal material layer 322m may be formed using an atomic layer deposition (ALD) process, a chemical vapor deposition (CVD) process, or a physical vapor deposition (PVD) process. The barrier metal material layer 322m may include, for example, titanium (Ti) and/or titanium nitride (TiN).

In addition, a conductive material layer 324m may be formed on the entire top surface of the barrier metal material layer 322m. The conductive material layer 324m may include tungsten (W) and may be formed using a CVD process.

Figure 8C:
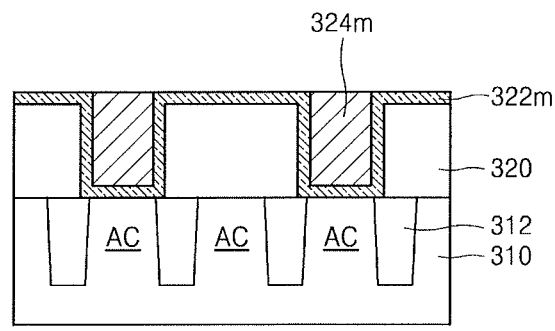

Referring to FIG. 8C, a CMP process may be performed on the conductive material layer 324m to confine the conductive material layer 324m inside the recess RE. In this case, the CMP process may be performed using the barrier metal material layer 322m as a polishing stop film.

In addition, when a CMP process is performed on a metal film, the CMP process may be performed by adding an oxidizer, such as hydrogen peroxide, in an acidic atmosphere. In an example embodiment, when the conductive material layer 324m is polished using a CMP slurry composition, the CMP slurry composition may not include an oxidizer.

Figure 8D:
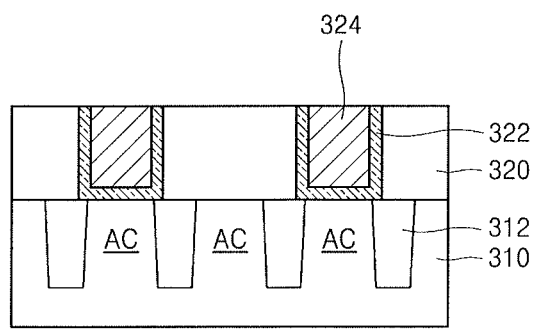

Referring to FIG. 8D, a CMP process may be performed on the exposed barrier metal material layer 322m so that a barrier metal layer 322 (as well as a plurality of conductive regions 324) may be defined in each of the contact holes and complete node separation may be performed between the contact holes. The CMP process may be performed using a CMP slurry composition including ceramic particles surfaces of which are modified with specific functional groups, for example.

In the process of FIG. 8D, the CMP process may be performed by using the CMP slurry composition that does not include an oxidizer, like the process described with reference to FIG. 8C.

FIGS. 8C and 8D illustrate a case in which a two-step CMP process is performed using each of the barrier metal material layer 322m and the interlayer insulating film 320 as a polishing stop film. However, in some embodiments, a single CMP process may be performed using only the interlayer insulating film 320 as a polishing stop film.

The CMP slurry composition may be controlled to have a pH value of about 1 to about 9. However, when a metal is polished as shown in FIGS. 8C and 8D, the CMP slurry composition may be controlled to be acidic, and may have a pH value of about 1 to about 4.

The plurality of conductive regions 324 may be connected to one terminal of a switching device such as a field-effect transistor (FET), which may be formed on the substrate 310. The plurality of conductive regions 324 may include polysilicon (poly-Si), a metal, a conductive metal nitride, a metal silicide, or a combination thereof, for example.

Figure 8E:
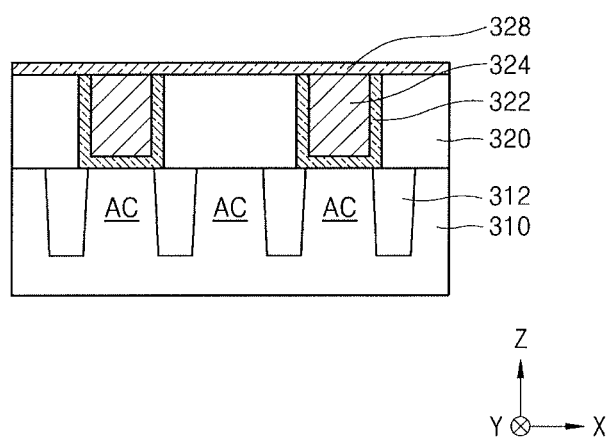

Referring to FIG. 8E, an insulating layer 328 may be formed to cover the interlayer insulating film 320 and the plurality of conductive regions 324. The insulating layer 328 may be used as an etch stop layer.

The insulating layer 328 may include an insulating material having etch selectivity with respect to the interlayer insulating film 320 and the mold layer 330 (refer to FIG. 8F) formed during a subsequent process. In an example embodiment, the insulating layer 328 may include silicon nitride, silicon oxynitride, or a combination thereof.

In an example embodiment, the insulating layer 328 may be formed to a thickness of about 100 Å to about 600 Å, for example.

Figure 8F:
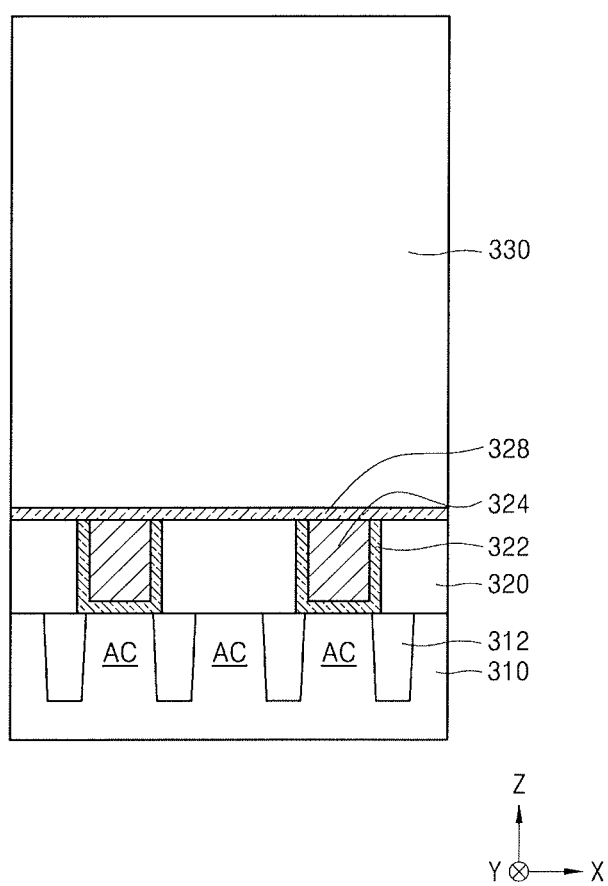

Referring to FIG. 8F, a mold layer 330 may be formed on the insulating layer 328.

In an example embodiment, the mold layer 330 may include an oxide layer. For example, the mold layer 330 may include a silicon oxide layer. The silicon oxide layer included in the mold layer 330 may be formed using the method described with reference to FIGS. 1 to 2C. In an example embodiment, the mold layer 330 may be formed to a thickness of about 1000 Å to about 20000 Å.

In an example embodiment, the mold layer 330 may include a supporting film, which may be formed using a material having etch selectivity with respect to the mold layer 330 and which may have a thickness of about 50 Å to about 3000 Å. The supporting film may include a material having a relatively low etch rate with respect to an etching atmosphere used to remove the mold layer 330 during a subsequent process. For example, when the mold layer 330 is subsequently removed by a lift-off process using LAL (including ammonium fluoride ($NH_4F$), hydrofluoric acid (HF), and water), the supporting film may include a material having a relatively low etch rate with respect to LAL. In an example embodiment, the supporting film may include silicon nitride, silicon carbonitride, tantalum oxide, titanium oxide, or a combination thereof.

Figure 8G:
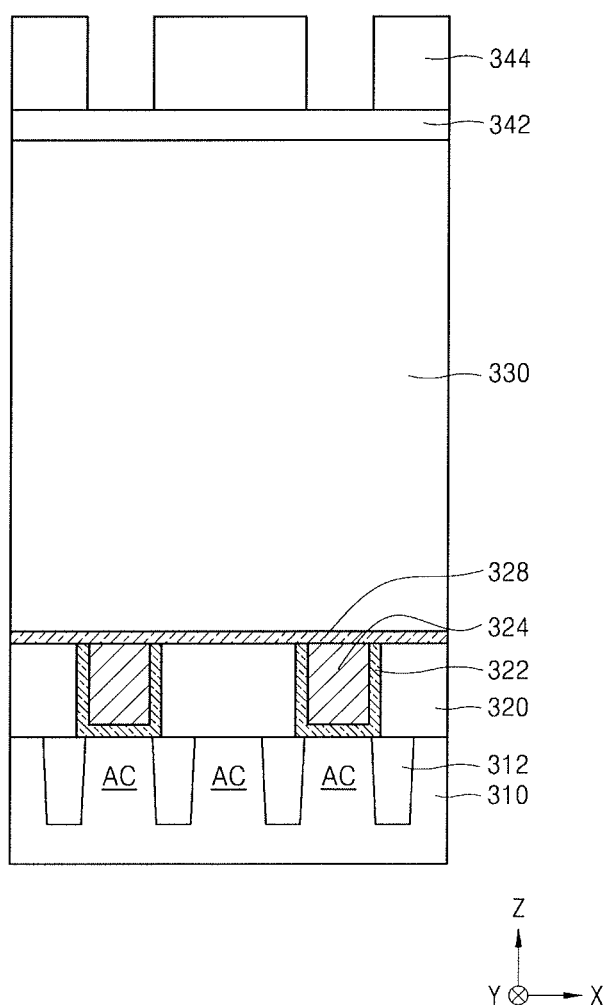

Referring to FIG. 8G, a sacrificial film 342 and a mask pattern 344 may be sequentially formed on the mold layer 330.

The sacrificial film 342 may include an oxide layer, for example, an oxide layer formed using a borophosphosilicate glass (BPSG) process, a phosphosilicate glass (PSG) process, an undoped silicate glass (USG) process, a spin-on-dielectric (SOD) process, or a high-density-plasma chemical vapor deposition (HDP CVD) process. The sacrificial film 342 may have a thickness of about 500 Å to about 2000 Å. The sacrificial film 342 may serve to protect a supporting film included in the mold layer 330.

The mask pattern 344 may include an oxide layer, a nitride film, a poly-Si film, a photoresist film, or a combination thereof. A region in which a lower electrode of a capacitor will be formed may be defined by the mask pattern 344.

Figure 8H:
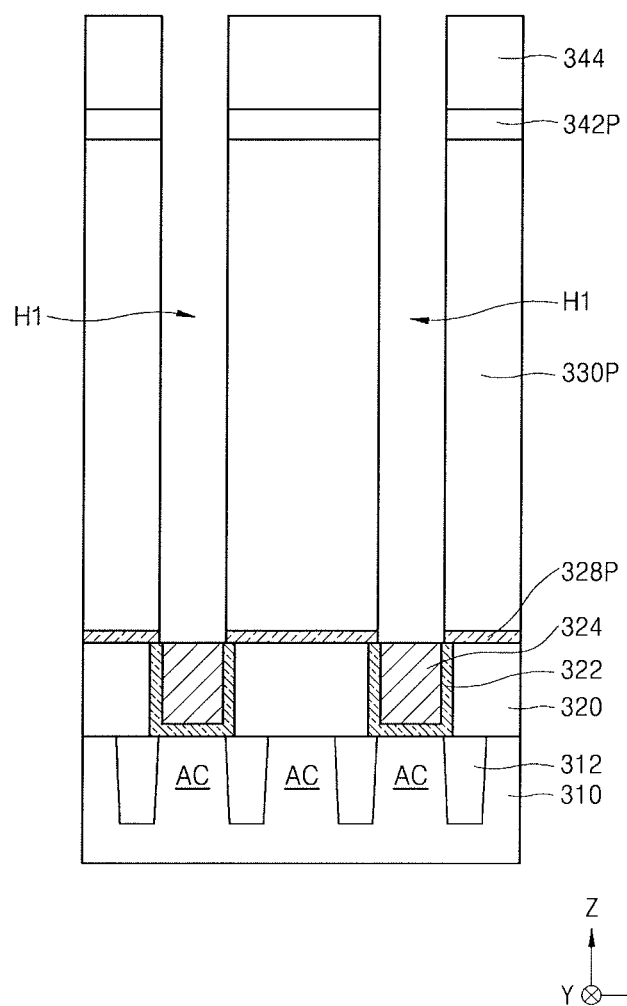

Referring to FIG. 8H, the sacrificial film 342 and the mold layer 330 may be dry etched using the mask pattern 344 as an etch mask and the insulating layer 328 as an etch stop layer, thereby forming a sacrificial pattern 342P and a mold pattern 330P defining a plurality of holes H1.

The insulating layer 328 may be also etched, e.g., due to excessive etching, thereby forming insulating patterns 328P exposing the plurality of conductive regions 324.

Figure 8I:
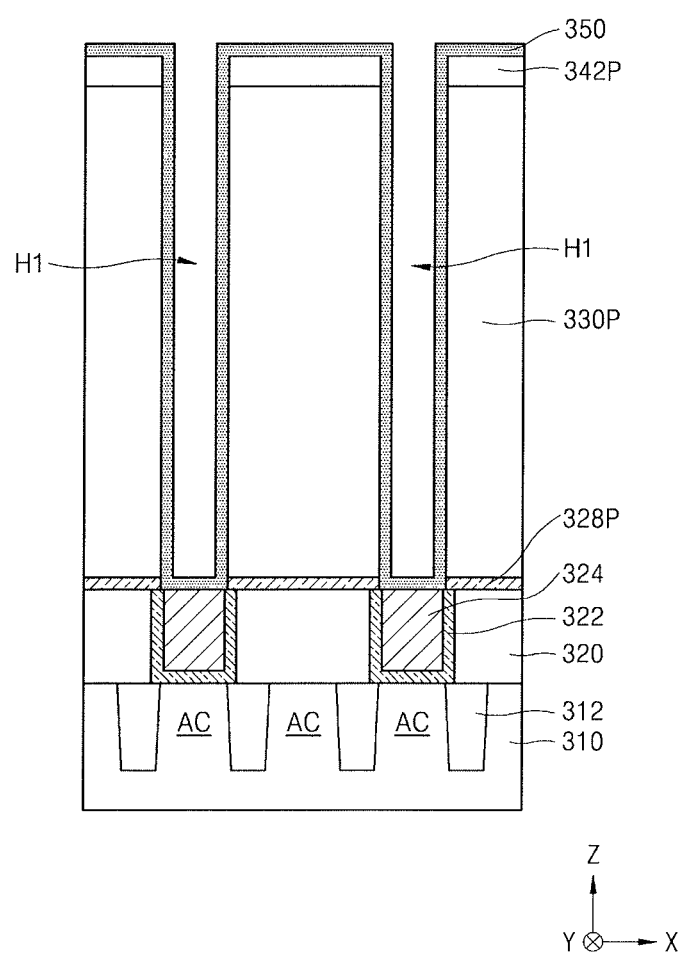

Referring to FIG. 8I, the mask pattern 344 may be removed from the resultant structure shown in FIG. 8H, and a conductive layer 350 for forming a lower electrode may be formed to cover an inner sidewall of each of the plurality of holes H1, exposed surfaces of the insulating patterns 328P, surfaces of the plurality of conductive regions 324 respectively exposed by the plurality of holes and an exposed surface of the sacrificial pattern 342P.

The conductive layer 350 for forming the lower electrode may be conformally formed on sidewalls of the plurality of holes H1 to partially leave an inner space of each of the plurality of holes H1.

In an example embodiment, the conductive layer 350 for forming the lower electrode may include a doped semiconductor, a conductive metal nitride, a metal, a metal silicide, a conductive oxide, or a combination thereof. For example, the conductive layer 350 for forming the lower electrode may include TiN, TiAlN, TaN, TaAlN, W, WN, Ru, $RuO_2$, Ir, $IrO_2$, Pt, PtO, $SrRuO_3$ (SRO), $(Ba,Sr)RuO_3$ (BSRO), $CaRuO_3$ (CRO), $(La,Sr)CoO_3$ (LSCo), or a combination thereof.

The conductive layer 350 for forming the lower electrode may be formed using a CVD process, a metal organic CVD (MOCVD) process, or an ALD process. The conductive layer 350 for forming the lower electrode may be formed to a thickness of about 20 nm to about 100 nm, for example.

Figure 8J:
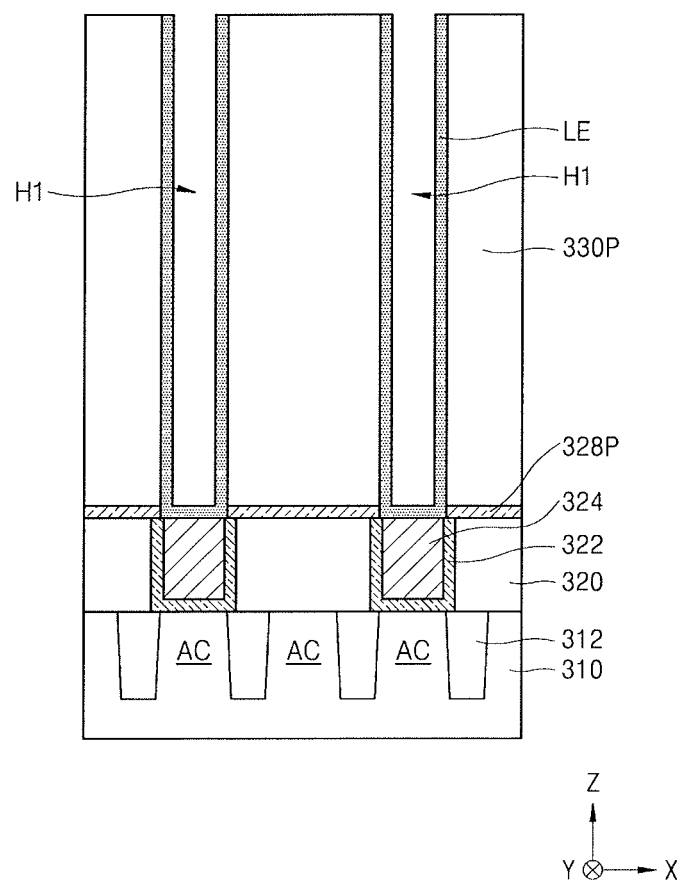

Referring to FIG. 8J, an upper portion of the conductive layer 350 for forming the lower electrode may be partially removed so that the conductive layer 350 for forming the lower electrode may be separated into a plurality of lower electrodes LE.

To form the plurality of lower electrodes LE, a part of the upper portion of the conductive layer 350 for forming the lower electrode and the sacrificial pattern 342P (refer to FIG. 8I) may be removed using an etchback process or a CMP process until a top surface of the mold pattern 330P is exposed.

The plurality of lower electrodes LE may be formed through the insulating patterns 328P and connected to the conductive regions 324.

Figure 8K:
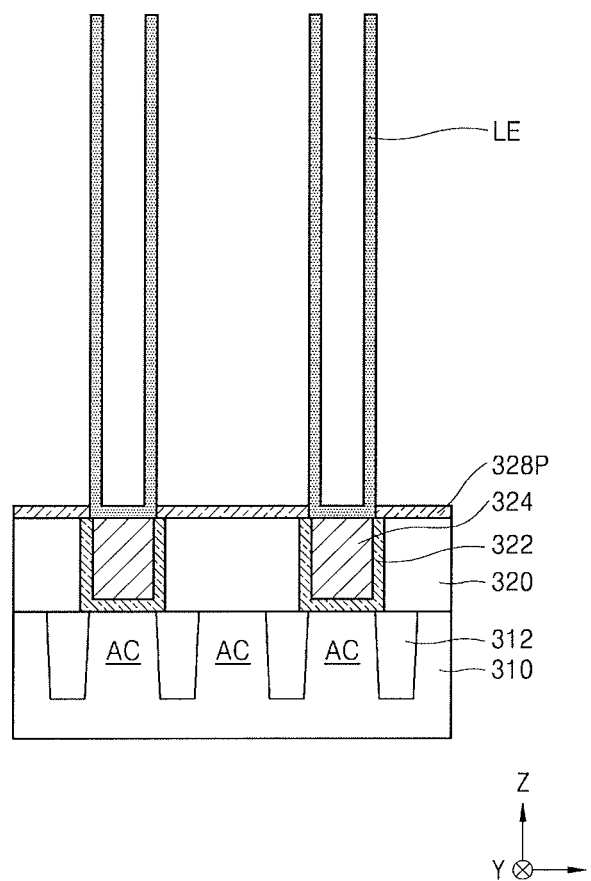

Referring to FIG. 8K, the mold pattern 330P may be removed to expose outer wall surfaces of the plurality of lower electrodes LE having a cylindrical shape.

The mold pattern 330P may be removed by a lift-off process using LAL or fluoric acid.

Figure 8L:
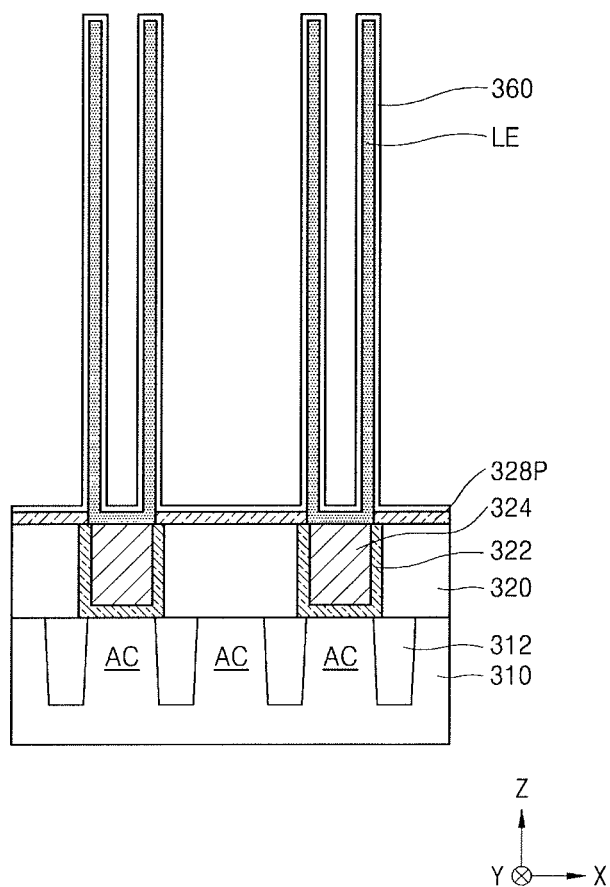

Referring to FIG. 8L, a dielectric film 360 may be formed on the plurality of lower electrodes LE.

The dielectric film 360 may be formed to conformally cover the exposed surfaces of the plurality of lower electrodes LE.

The dielectric film 360 may be formed by using an ALD process.

The dielectric film 360 may include an oxide, a metal oxide, a nitride, or a combination thereof. In an example embodiment, the dielectric film 360 may include a $ZrO_2$ film. For example, the dielectric film 360 may include a single layer of a $ZrO_2$ film or a multilayered structure including a combination of at least one $ZrO_2$ film and at least one $Al_2O_3$ film.

In an example embodiment, the dielectric film 360 may have a thickness of about 50 Å to about 150 Å.

Figure 8M:
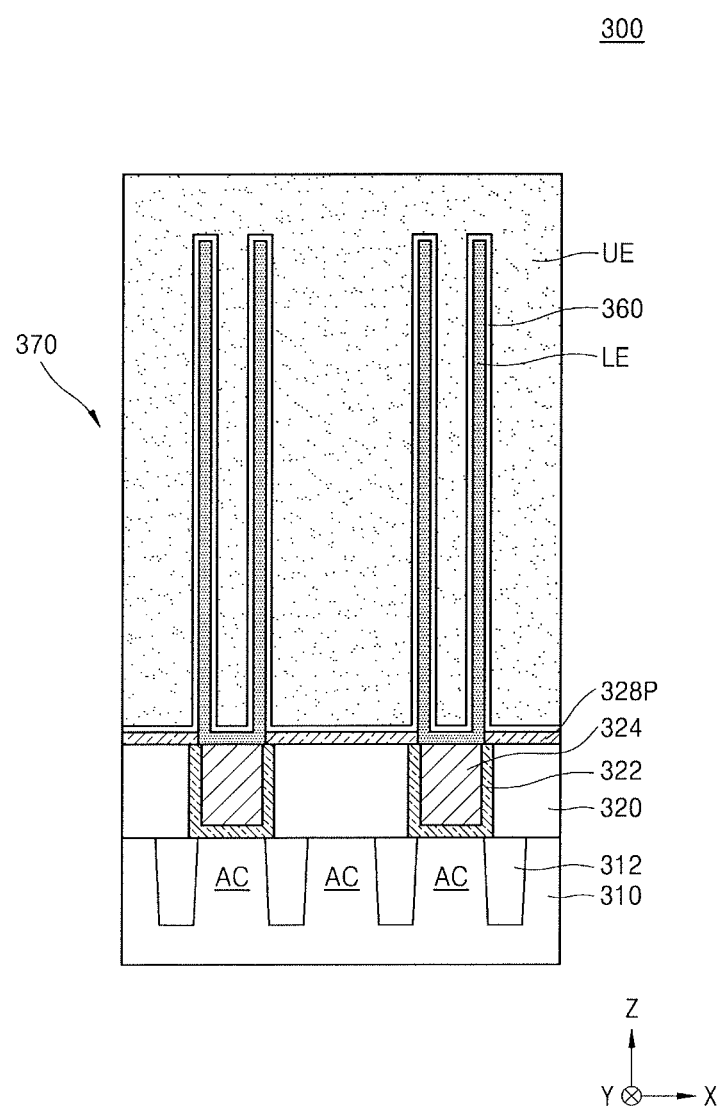

Referring to FIG. 8M, an upper electrode UE may be formed on the dielectric film 360.

The lower electrode LE, the dielectric film 360, and the upper electrode UE may constitute a capacitor 370.

The upper electrode UE may include a doped semiconductor, a conductive metal nitride, a metal, a metal silicide, a conductive oxide, or a combination thereof. For example, the upper electrode UE may include TiN, TiAlN, TaN, TaAlN, W, WN, Ru, $RuO_2$, Ir, $IrO_2$, Pt, PtO, $SrRuO_3$ (SRO), $(Ba,Sr)RuO_3$ (BSRO), $CaRuO_3$ (CRO), $(La,Sr)CoO_3$ (LSCo), or a combination thereof.

The upper electrode UE may be formed using a CVD process, an MOCVD process, a PVD process, or an ALD process.

A method of manufacturing the semiconductor device 300 including the process of forming the dielectric film 360 covering the surfaces of the lower electrodes LE having the cylindrical shapes has been described with reference to FIGS. 8A to 8M. In another implementation, pillar-type lower electrodes having no inner spaces may be formed instead of the lower electrodes LE having the cylindrical shape, and the dielectric film 360 may be formed on the pillar-type lower electrodes.

According to the method of manufacturing the semiconductor device 300 according to the present example embodiment, which is described with reference to FIGS. 8A to 8M, to form the barrier metal layer 322 and the conductive regions 324, a CMP process may be performed using the CMP slurry composition.

By way of summation and review, with the continuous shrinkage of semiconductor devices, it is desired to improve characteristics of oxides filling fine gaps. For example, oxide layers, which may be uniformly manufactured and have excellent characteristics, may be used for device isolation films or interlayer insulating films configured to electrically isolate semiconductor devices from each other.

As described above, embodiments relate to a method of forming an oxide layer and a method of manufacturing a semiconductor device, by which a uniform oxide layer having low stress may be formed without voids. Embodiments may provide a method of forming an oxide layer, by which a uniform oxide layer having low stress may be formed without voids. Embodiments may also provide a semiconductor device exhibiting high reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming an oxide layer, the method comprising:
    forming a first material layer on a semiconductor substrate, the first material layer including a polysiloxane material, wherein, from among Si—$H_1$, Si—$H_2$, and Si—$H_3$ bonds included in the polysiloxane material, a percentage of Si—$H_2$ bonds ranges from about 40% to about 90%;
    performing a first annealing process on the first material layer in an inert atmosphere; and
    performing a second annealing process on the first material layer in an oxidative atmosphere.

2. The method as claimed in claim 1, wherein, from among the Si—$H_1$, Si—$H_2$, and Si—$H_3$ bonds included in the polysiloxane material, a percentage of the Si—$H_3$ bonds ranges from about 0.01% to about 10%.

3. The method as claimed in claim 1, wherein a weight-average molecular weight of the polysiloxane material ranges from about 4,000 to about 200,000.

4. The method as claimed in claim 1, wherein a weight-average molecular weight of the polysiloxane material ranges from about 5,000 to about 25,000.

5. The method as claimed in claim 1, wherein Si—H bonds are substantially absent in the oxide layer.

6. The method as claimed in claim 1, wherein a peak corresponding to a Si—H bond is not detected in a Fourier transform infrared (FT-IR) analysis performed on the oxide layer.

7. The method as claimed in claim 1, wherein each of the first annealing process and the second annealing process is independently performed at a temperature of about 500° C. to about 700° C.

8. The method as claimed in claim 7, wherein each of the first annealing process and the second annealing process is independently performed at a temperature of about 600° C. to about 700° C.

9. The method as claimed in claim 1, wherein each of the first annealing process and the second annealing process is independently performed for about 20 minutes to about 90 minutes.

10. The method as claimed in claim 1, wherein the second annealing process is performed in an atmosphere including at least one of $O_2$, $H_2O$, $H_2O_2$, and $O_3$.

11. The method as claimed in claim 1, wherein the forming of the first material layer includes spin-coating the polysiloxane material.

12. The method as claimed in claim 1, wherein the polysiloxane material is substantially free of elements other than silicon (Si), oxygen (O), and hydrogen (H).

13. The method as claimed in claim 1, wherein the first annealing process is performed before the second annealing process.

14. The method as claimed in claim 13, wherein the second annealing process is performed directly after the first annealing process.

15. A method of manufacturing a semiconductor device, the method comprising:
    forming a trench in a semiconductor substrate, the trench defining an active region;
    forming a first material layer in the trench, the first material layer including a polysiloxane material, wherein a weight-average molecular weight of the polysiloxane material ranges from about 5,000 to about 25,000;
    performing a first annealing process on the first material layer in an inert atmosphere;
    performing a second annealing process on the first material layer on which the first annealing process has been performed, in an oxidative atmosphere; and
    forming a memory device in the active region.

16. The method as claimed in claim 15, wherein, from among Si—$H_1$, Si—$H_2$, and Si—$H_3$ bonds included in the polysiloxane material, a percentage of the Si—$H_2$ bonds ranges from about 40% to about 90%.

17. The method as claimed in claim 15, further comprising performing a third annealing process on the first material layer after the performing of the second annealing process.

18. The method as claimed in claim 17, wherein the third annealing process is performed in an inert atmosphere at a temperature of about 800° C. to about 1050° C.

19. A method of forming an oxide layer, the method comprising:
   forming a first material layer on a semiconductor substrate, the first material layer including a polysiloxane material, wherein the polysiloxane material is prepared by Equation 1:

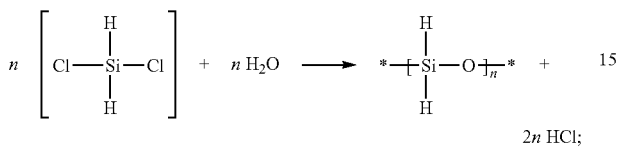

$$2n \text{ HCl};$$

performing a first annealing process on the first material layer in an inert atmosphere; and
   performing a second annealing process on the first material layer in an oxidative atmosphere.

20. The method as claimed in claim 19, wherein, from among Si—$H_1$, Si—$H_2$, and Si—$H_3$ bonds included in the polysiloxane material, a percentage of Si—$H_2$ bonds ranges from about 50% to about 90%, and a percentage of Si—$H_3$ bonds ranges from about 0.01% to about 10%.

* * * * *